United States Patent
Yau et al.

(10) Patent No.: US 10,841,885 B2
(45) Date of Patent: Nov. 17, 2020

(54) METHOD AND SYSTEM FOR CARRYING OUT TIMING RELATED TASKS

(71) Applicants: SINGAPORE UNIVERSITY OF TECHNOLOGY AND DESIGN, Singapore (SG); ILLINOIS AT SINGAPORE PTE LTD, Singapore (SG)

(72) Inventors: David K.Y. Yau, Singapore (SG); Yang Li, Singapore (SG); Rui Tan, Singapore (SG); Sreejaya Viswanathan, Singapore (SG)

(73) Assignees: SINGAPORE UNIVERSITY OF TECHNOLOGY AND DESIGN, Singapore (SG); ILLINOIS AT SINGAPORE PTE LTD, Singapore (SG)

( * ) Notice: Subject to any disclaimer, the term of this patent is extended or adjusted under 35 U.S.C. 154(b) by 0 days.

(21) Appl. No.: 16/464,264

(22) PCT Filed: Nov. 24, 2017

(86) PCT No.: PCT/SG2017/050581
§ 371 (c)(1),
(2) Date: May 24, 2019

(87) PCT Pub. No.: WO2018/097800
PCT Pub. Date: May 31, 2018

(65) Prior Publication Data
US 2019/0327697 A1    Oct. 24, 2019

(30) Foreign Application Priority Data

Nov. 25, 2016  (SG) .............................. 10201609938T
Apr. 7, 2017   (SG) .............................. 10201702886Y

(51) Int. Cl.
*H04J 3/06* (2006.01)
*H04W 56/00* (2009.01)
(Continued)

(52) U.S. Cl.
CPC .......... *H04W 56/001* (2013.01); *G01R 29/18* (2013.01); *G06K 9/0055* (2013.01); *H04J 3/0661* (2013.01); *H04L 7/0012* (2013.01)

(58) Field of Classification Search
None
See application file for complete search history.

(56) References Cited

U.S. PATENT DOCUMENTS

| | | | |
|---|---|---|---|
| 2012/0093240 A1 | 4/2012 | McFarland et al. | |
| 2013/0116844 A1* | 5/2013 | McNally | H02J 3/14 700/295 |

(Continued)

FOREIGN PATENT DOCUMENTS

CN    103945522 A    7/2014

OTHER PUBLICATIONS

International Search Report and Written Opinion of International Search Authority for International Patent Application No. PCT/SG2017/050581.

(Continued)

*Primary Examiner* — Phirin Sam
(74) *Attorney, Agent, or Firm* — JCIP; Joseph G. Chu; Jeremy I. Maynard

(57) ABSTRACT

Embodiments of the present invention provide a method and system for timing related tasks in IoT systems, for example, in relation to synchronisation of clocks and timestamping. It is desirable that the method and system is able to withstand external tampering in a manner which does not jeopardise the accuracy and integrity of time related tasks in the IoT systems.

19 Claims, 5 Drawing Sheets

(51) Int. Cl.
*G01R 29/18* (2006.01)
*G06K 9/00* (2006.01)
*H04L 7/00* (2006.01)

(56) References Cited

U.S. PATENT DOCUMENTS

| | | | |
|---|---|---|---|
| 2013/0169309 A1* | 7/2013 | Bickel | H02J 3/24 |
| | | | 324/764.01 |
| 2014/0012524 A1 | 1/2014 | Flammer, III | |
| 2015/0092796 A1* | 4/2015 | Aweya | H04J 3/0667 |
| | | | 370/516 |
| 2015/0241482 A1 | 8/2015 | Sonderegger | |
| 2015/0318705 A1* | 11/2015 | Lucas | H02J 3/383 |
| | | | 307/129 |
| 2016/0077546 A1* | 3/2016 | Herbeck | G06F 1/12 |
| | | | 327/145 |
| 2016/0097796 A1* | 4/2016 | Flammer, III | H02J 13/00002 |
| | | | 702/60 |
| 2016/0182621 A1* | 6/2016 | Errickson | H04L 67/1095 |
| | | | 709/204 |
| 2016/0352819 A1* | 12/2016 | Errickson | H04L 67/1095 |

OTHER PUBLICATIONS

Rowe A. et al., Low-power Clock Synchronization using Electromagnetic Energy Radiating from AC Power Lines. Proceedings of the 7th ACM Conference on Embedded Networked Sensor Systems, SenSys '09, Nov. 6, 2009, pp. 211-224 [Retrieved on Jan. 29, 2018] <DOI: 10.1145/1644038.1644060> Whole document.

* cited by examiner (a)　　　　　　　　　　　　　　(b)

METHOD AND SYSTEM FOR CARRYING OUT TIMING RELATED TASKS

FIELD OF INVENTION

The present invention relates to a method and system for carrying out timing related tasks.

BACKGROUND

In the era of Internet of Things (IoT), networked sensors and embedded smart devices are increasingly being incorporated in civil infrastructure. Very substantial numbers of sensors have been/will be installed both in new "smart" buildings and retrofitted into existing buildings. Manufacturing industries are also evolving in the IoT era. Similarly, very substantial numbers of sensors have been/will be installed both in new production facilities and retrofitted into existing production facilities.

In order for all the sensors to function in a desirable manner, it is essential for all the sensors to have a common notion of time (CNoT). Accurate timestamping is crucial for interpreting data and associating data from different sensors, and synchronized clocks enable coordinated operations among the nodes to enable the desired functionalities. The converse is also true, whereby incorrect timestamps and clock desynchronization typically leads to system failure. Thus, a resilient and robust CNoT system is essential to safeguard against system failure for diverse wireless sensor networks (WSN) and IoT systems.

Currently, atomic clocks, GPS, and clock synchronization and calibration protocols are typical ways of maintaining CNoT. However, each of these methodologies has issues. For massive deployments, chip-scale atomic clocks are financially prohibitive. In addition, although GPS receivers can be configured to provide global time with desirable accuracy, indoor use is challenging. Regarding existing clock synchronization and calibration methods, there methods can be classified broadly into two categories:

1. Category one methods rely on exchanges of network messages among nodes to achieve synchronization. As these methods generally involve measuring delays in transmitting synchronization packets, a packet delay attack that maliciously delays the transmission causes synchronization errors. Unfortunately, this issue cannot be solved by conventional data security measures such as cryptographic authentication and encryption.

2. Category two methods rely on wireless time broadcasts (for example, the WWVB and DCF77 timekeeping radios) and external periodic signals (for example, periodic data blocks in FM radios, Wi-Fi beacons, and powerline electromagnetic radiation) for clock synchronization and calibration. To capture and/or decode the external signals, these methods require sophisticated hardware peripherals which hinder widespread adoption due to the increased node cost and complexity. Moreover, the wireless signals used (for example, FM/AM and Wi-Fi) can be easily interfered with or jammed remotely causing adverse effects on many nodes.

Industrial systems have also resorted to cyber isolation to protect their networks. However, the effectiveness of such isolation is questionable. For example, zero-day vulnerability exploits, insider attacks, stepping stone attacks and the like can circumvent the isolation. With regard to insider attacks (for example, by disgruntled employees), those who have access to network management facilities can easily carry out a packet delay attack at a strategic router, thereby jeopardising the integrity of time amongst the network nodes. Increased network connectivity due to adoption of IoT will only facilitate unauthorised access to industrial systems.

Hence, there are currently substantial issues pertaining to secure clock synchronization in IoT systems.

SUMMARY

In a first aspect, there is provided a system for determining a timestamp using powerline voltage fluctuations. The system includes one or more electronic devices configured to:
  determine, at a first node, a first voltage fluctuation sequence;
  determine, at a second node, the second node being on a power grid of the first node, a second voltage fluctuation sequence; and
  compare, data of the first and second voltage fluctuation sequences, to determine a clock offset between the first and second nodes,
  wherein each fluctuation sequence is a timestamp.

In a second aspect, there is provided a data processor implemented method for determining a timestamp using powerline voltage fluctuations. The method includes:
  determining, at a first node, a first voltage fluctuation sequence;
  determining, at a second node, the second node being on a power grid of the first node, a second voltage fluctuation sequence; and
  comparing, data of the first and second voltage fluctuation sequences, to determine a clock offset between the first and second nodes,
  wherein each fluctuation sequence is a timestamp.

In a third aspect, there is provided a non-transitory computer readable storage medium embodying thereon a program of computer readable instructions which, when executed by one or more processors of a first node in communication with at least one other processor of a second node, cause the first node to carry out a method for determining a timestamp using powerline voltage fluctuations. The method embodies the steps of:
  receiving, at a first node, first data of a first voltage fluctuation sequence at a second node, the second node being on a power grid of the first node;
  determining, at the first node, second data of a second voltage fluctuation sequence; and
  comparing, the first and second data, to determine a clock offset between the first and second nodes,
  wherein each fluctuation sequence is a timestamp.

In a further aspect, there is provided a system for synchronising clocks. The system includes one or more electronic devices that:
  determine, at a first node, a first node marker and a first node clock value;
  transmit, from the first node, a first data packet including the first node clock value and the first node marker;
  determine, at a second node, a second node marker and a second node clock value;
  receive, at the second node, the first data packet;
  synchronise, at the second node, both the first node clock value and the second node clock value, and
  determine, at the second node, an offset between the first node clock value and the second node clock value,
  wherein the respective node markers are determined from minute fluctuations of a cycle length of an electric voltage signal at each respective node.

There is also provided a data processor implemented method for synchronising clocks. The method comprises:
- determining, at a first node, a first node marker and a first node clock value;
- transmitting, from the first node, a first data packet including the first node clock value and the first node marker;
- determining, at a second node, a second node marker and a second node clock value;
- receiving, at the second node, the first data packet;
- synchronising, at the second node, both the first node clock value and the second node clock value, and
- determining, at the second node, an offset between the first node clock value and the second node clock value,
- wherein the respective node markers are determined from minute fluctuations of a cycle length of an electric voltage signal at each respective node.

Moreover, there is also provided a non-transitory computer readable storage medium embodying thereon a program of computer readable instructions which, when executed by one or more processors coupled to a first node in communication with at least one other processor coupled to a second power node, cause the first node to carry out a method for synchronising clocks. The method embodies the steps of:
- determining, at a first node, a first node marker and a first node clock value, the first node marker and the first node clock value being included in a first data packet;
- receiving, from a second node, a second data packet including a second node clock value and a second node marker;
- synchronising, at the first node, both the first node clock value and the second node clock value, and
- determining, at the first node, an offset between the first node clock value and the second node clock value,
- wherein the respective node markers are determined from minute fluctuations of a cycle length of an electric voltage signal at each respective node.

A penultimate aspect provides a system for determining a grid phase of a device. The system includes one or more electronic devices that:
- transmits, from the device, a pre-determined number of AC cycle lengths;
- receives, at a centralised server, the pre-determined number of AC cycle lengths on all three grid phases;
- defines, at the centralised server, a TiF length;
- applies, at the centralised server, a sliding window to extract multiple TiF signatures from a trace of the device;
- compares, at the centralised server, each TiF signature against a centralised server trace; and
- identifies, at the centralised server, the grid phase of the device.

Finally, there is also provided a data processor implemented method for determining a grid phase of a device. The method comprises:
- transmitting, from the device, a pre-determined number of AC cycle lengths;
- receiving, at a centralised server, the pre-determined number of AC cycle lengths on all three grid phases;
- defining, at the centralised server, a TiF length;
- applying, at the centralised server, a sliding window to extract multiple TiF signatures from a trace of the device;
- comparing, at the centralised server, each TiF signature against a centralised server trace; and
- identifying, at the centralised server, the grid phase of the device.

It will be appreciated that the broad forms of the invention and their respective features can be used in conjunction, interchangeably and/or independently, and reference to separate broad forms is not intended to be limiting.

DESCRIPTION OF FIGURES

A non-limiting example of the present invention will now be described with reference to the accompanying drawings, in which.

DETAILED DESCRIPTION

Embodiments of the present invention provide a method and system for timing related tasks in IoT systems, for example, in relation to synchronisation of clocks and time-stamping. It is desirable that the method and system is able to withstand external tampering in a manner which does not jeopardise the accuracy and integrity of time related tasks in the IoT systems. It should be appreciated that references to "IoT" devices in the foregoing description can refer to, for example, network connected devices like sensors, controllers, actuators, and the like.

Figure 1:
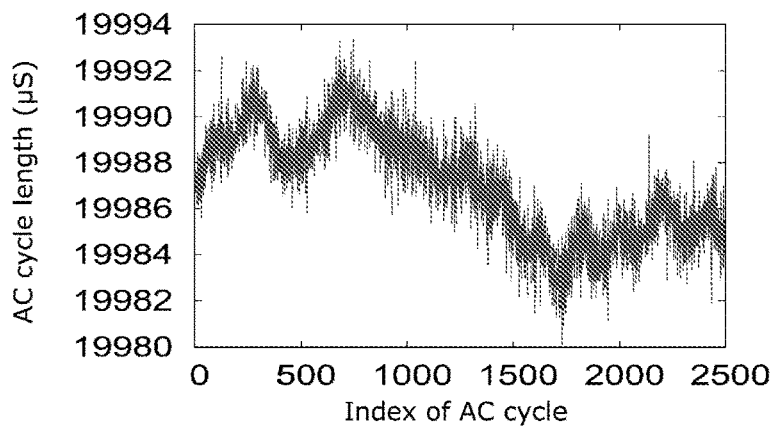
FIG. 1 shows an AC cycle length of a typical power grid's voltage signal.

Referring to FIG. 1, there is shown a typical power grid's voltage signal which exhibits minor frequency fluctuations which are random in nature. For a 50 Hz grid the AC cycle length should be 20 ms, but FIG. 1 shows how the AC cycles fluctuate randomly in the microseconds scale. Due to the imbalance between generation and load, the electrical network frequency (ENF) fluctuates around the nominal 50 Hz value. Within the same power grid, such ENF fluctuations are synchronous across multiple locations. In addition, the aforementioned random fluctuations can be uniformly observed at various physical locations of the grid. These random cycle length fluctuations of a specific length can be defined as frequency fingerprints.

In the following description, various parameters of the frequency fingerprints are utilised to develop time-based applications including time synchronization, automatic grid phase identification, localization etc. The system architecture can utilise powerline signals (electrical network voltage, ENV) directly measured from the power sockets and through other indirect means like electromagnetic radiations (EMR) near the power line. There is provided low cost apparatus that are configured to measure the powerline signals directly and indirectly.

Based on the frequency fingerprints mentioned earlier, the following applications have been developed:

a) Time-based tasking: By using a similarity-based matching algorithm on the randomness of the frequency fingerprints, a set of frequency fingerprints of sufficient length captured by a first node (A) can be appropriately time-aligned within a trace of AC cycle lengths captured by another node (B), at the granularity of an AC cycle. As such, different variants of the system is able to achieve the following:
1) Secure time synchronization for distributed devices
2) Network-free data logger
3) Run-Time clock verification
4) Authentication of critical recorded data b) Grid identification: A power grid typically has 3 phases R, Y and B. The frequency fingerprints of nodes that belong to the same grid phase have a higher degree of similarity while compared to those that belong to different grid phases. Correspondingly, a probability distribution function is utilised to automatically identify the phase of the grid that a node belongs to.

The power lines radiate electromagnetic signals to the ambient environment. The 50 Hz signals, electromagnetic radiation (EMR), can be detectable at distances up to twenty meters, and is suitable for indoor applications. The detection deployment should be near the power lines, so that EMR sensors are able to detect the electromagnetic radiation from the lines. This condition is typically satisfied when the sensor is placed within buildings in a typical urban environment.

EMR sensors are attached to respective nodes within the same power grid, to record the ENF fluctuations. By comparing the ENF fluctuations, a clock offset between a pair of two nodes can be identified.

Figure 3:
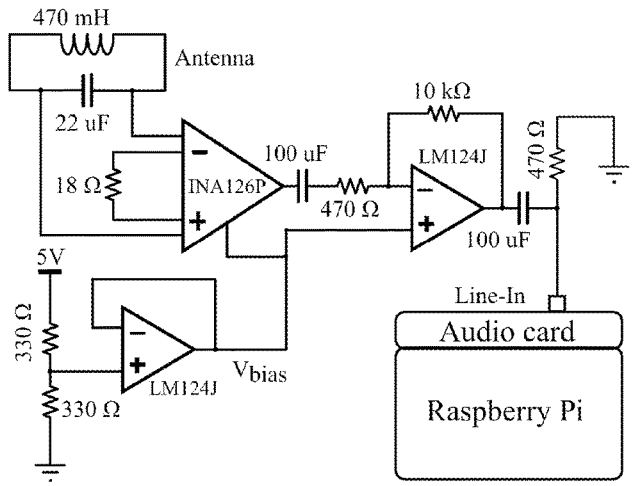
FIGS. 3(a) and 3(b) show a schematic view and a simplified hardware view of an EMR sensor respectively.
Figure 3:
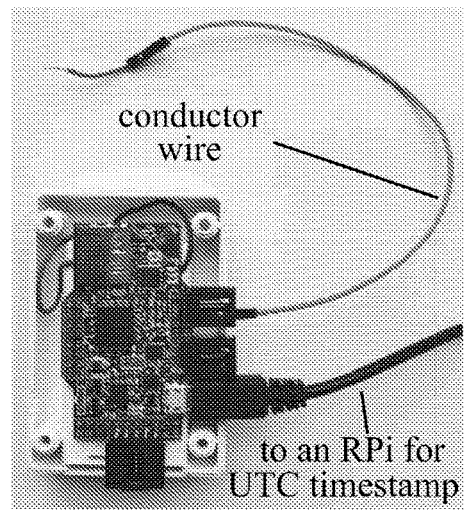

FIG. 3(a) provides a general schematic of the EMR sensor as referred to earlier. As shown in FIG. 3(a), the EMR sensor can be configured from a plurality of components such as, for example, capacitors, resistors, amplifiers, and so forth. For example, if the EMR signal is strong and the node has one ADC pin available, the EMR sensor can just be a length of conducting wire communicatively connected to the node, as shown in FIG. 3(b).

Figure 2:
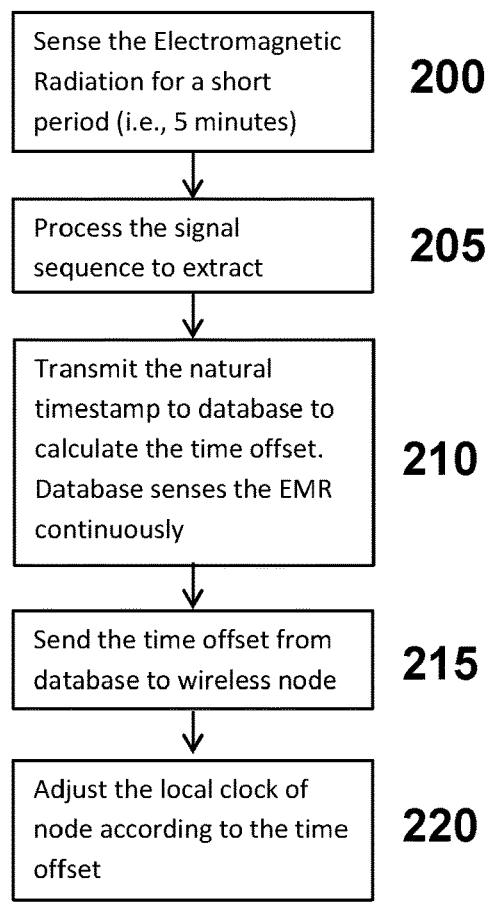
FIG. 2 shows a flow chart of an example of a method for time synchronisation between nodes.

FIG. 2 shows an embodiment for a method for time synchronisation between nodes. At step 200, an EMR sensor, for example as described in FIG. 3, at a node is configured to detect EMR for a pre-determined period, for example, for between three and eight minutes.

At step 205, the detected EMR signal is processed to filter unwanted components to increase the comparison accuracy. For example, a band pass filter [45 Hz, 55 Hz] is used to remove the DC bias and high frequency spikes. In addition, a moving average filter can be applied to the signal to further remove high frequency components and reduce the sequence length. The moving window parameters, namely, window width (W) and window step (S), is adjustable to match different levels of signal quality. In most of the cases, the W is defined as 50, and S is defined as 49, depending on a trade-off between precision and sequence length. In order to facilitate the ENF fluctuation comparison, an EMR-based timestamp is defined. In brief, the EMR-based timestamp is a finite-length sequence of ENF fluctuations. The ENF fluctuation comparison is based on the EMR-based timestamps from different nodes.

To improve accuracy of the ENF fluctuation comparison, one node is defined as a database node, which is attached with a high-precision clock source (for instance, a GPS receiver). To further improve the accuracy of the comparison results, the database node can use a voltage sensor to measure the ENF fluctuations directly from a power outlet of the database node. As such, another node in the same power grid will compare its EMR-based timestamp with the database node.

At step 210, once the database node receives the EMR-based timestamp f from another node, a time offset is determined in relation to the database EMR-based timestamp g, given by, $$i^* = \mathrm{argmin}_{i \in [1, m-n+1]} \; \mathrm{dissimilarity}(f, g[i:i+n-1]) \quad (1)$$

Where g[i:i+n−1] represents a vector that consists of the ith to (t+n−1)th elements of g. Then the timestamp of f[0] is identified by g[i*]. Thus, the time when f is captured is known. Thereafter, the time offset information between the node and the database node is determined.

Subsequently, the time offset information is then transmitted to the node from the databased node at step 215. The data transmission between nodes can be carried out one or a few times per day depending on the accuracy requirements. To illustrate how much data will be exchanged between the nodes, consider the following example for ten minutes of sampling:

One sample point=2 bytes
Moving window W=50, S=1
One second=50 samples
600 seconds=60 kBytes
Moving window W=50, S=49
One second=1 sample
600 seconds=1.2 kBytes As step 220, upon receipt of the time offset information, a local clock of the node is able to be adjusted in a manner which is in sync with the time offset.

In another aspect, there is provided detection of a marker embedded within an ENV signal, which is defined as a time fingerprint (TiF). A TiF is a vector of successive AC cycle lengths of the ENV signal. An exemplary TiF signal is as shown in FIG. 1. As described earlier, using a similarity-based matching algorithm, a TiF of sufficient length captured by a node (A) can be correctly time-aligned within a trace of AC cycle lengths captured by another node (B) at the granularity of an AC cycle.

Figure 4:
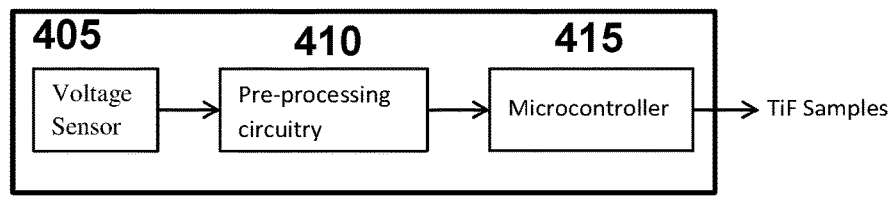
FIG. 4 shows an example of a schematic view of a time fingerprint detection hardware as used in the present invention.

FIG. 4 shows an example of a schematic view of a TiF detection apparatus 400. It consists of a voltage sensor 405 that can measure grid voltage fluctuations, a pre-processing circuitry 410 configured for conditioning sensor signal, and a microcontroller 415 that can be configured to measure the AC cycle length with microsecond precision.

Figure 5:
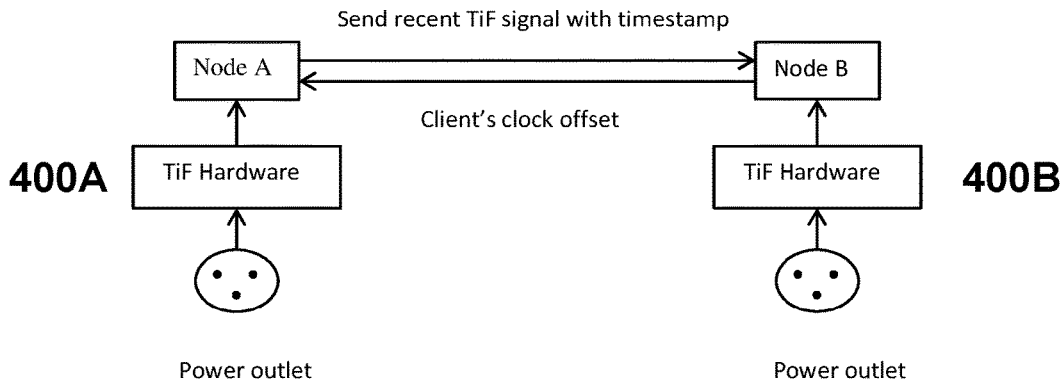
FIG. 5 shows an example of a system for carrying out a method of synchronising time settings at respective nodes.
Figure 7:
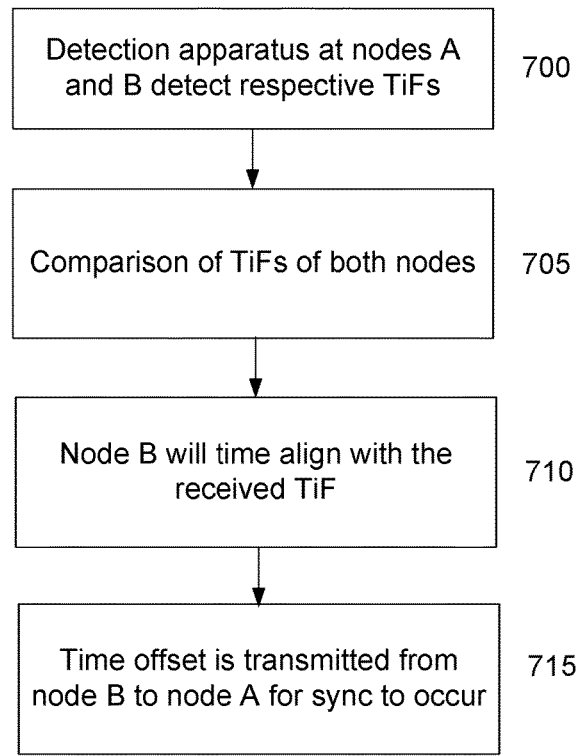
FIG. 7 shows a flow chart of another example of a method for time synchronisation between nodes.

A method depicting use of the detection apparatus 400 is shown in FIGS. 5 and 7. Specifically, the method is employed in a synchronization session between a packet from node A to node B that contains a TiF captured by A, and the corresponding A's clock value.

At step 700, 400A is able to detect a TiF of node A, while 400B is able to detect a TiF of node B. Based on a comparison of the TiFs of both nodes at step 705, B will be able to time-align the received TiF within its own historical AC cycle lengths timestamped with its clock at step 710. As such, it will be possible to determine an offset between A's and B's clocks. At step 715, this offset is communicated back to A, A can then calibrate its clock to synchronize with that of B.

The synchronization method is independent of any delays introduced in the communications between A and B, as there is no dependence on any explicit measurements of the transmission delays. The method can be applied for pair of nodes and can underpin a complete clock synchronization system between all the distributed network nodes. Furthermore, in some embodiments, at least one sensor at A can be configured to detect ENF signals from an ENF signal generator, such as, for example, mechanical vibration from AC motors, ENF noise in audio/video recordings, ENF traces in other radio frequency signal transmissions, ENF traces from light intensity fluctuation, and so forth.

Algorithm:

A TiF, denoted by x, is a vector of n consecutive AC cycle lengths measured by node A. Let a vector y denote a trace of m consecutive AC cycle lengths measured by node B. The measurements in y are timestamped with B's clock, whereas only the last element of x is timestamped with A's clock. The time duration of measuring x is within the time duration of measuring y, which is denoted as $x \triangleleft y$. Decoding x means identifying the time instant, according to B's clock, for the last element of x (i.e., x[n]). The basic idea of the decoding is to match x with a TiF within a window of size n in y using a similarity metric, e.g., reciprocal of sum of square errors. By sliding the window within y, the timestamp of the last element of the window that yields the largest similarity is identified as the time instant for x[n]. Formally, the index of the window that yields the largest similarity is given by $$i = \operatorname{argmax}_{i \in [1, m-n+1]} S(x, y[i:i+n-1]) \quad (1)$$

where s(•,•) is the similarity function and y[i:i+n−1] represents a vector consisting of the $i^{th}$ (i+n−1)$^{th}$ elements of y. Then, the decoding algorithm outputs the timestamp of the last element of the window (i.e., y[i*+n−1]) for x[n].

It should be appreciated that embodiments of the aforementioned method enable some advantages. The correct timestamp can be re-constructed in an asynchronous manner, whose accuracy is independent of elapsed time since an instance of powerline frequency fingerprint timestamp recording. As such, the method is able to overcome the issue of delayed attack vulnerability for network time protocol (NTP). The timestamp accuracy is based on the comparison results between two ENF recordings and a delayed message does not affect the timestamp accuracy.

Another advantage relates to using the aforementioned embodiments of the method for secure time synchronization for IoT sensors. Currently, the time accuracy of sensor nodes is often maintained by periodic exchanging of network messages. Certain sensor nodes may even have a local clock only. A synchronizing node can measure ENF traces for a given period (for instance, 5 minutes); then it processes the ENF traces to extract the powerline frequency fingerprint timestamps associated with the local clock. After that, any clock drift could be identified by sending the powerline frequency fingerprint timestamp packets to the database. Such identification can be one or a few times per day depending on the respective requirements.

Embodiments of the method can also be used as a network-free data logger. With powerline frequency fingerprint timestamping, a sensor's data timestamps based on its local clock can be rectified using powerline frequency fingerprint timestamps in offline data analysis. Specifically, at run time, the logger captures a powerline frequency fingerprint timestamp periodically, and includes a local clock timestamp. In the offline data analysis, the offset of the local clock can be identified by decoding the powerline frequency fingerprint timestamps. For instance, the data logger could be placed at a non-networked coverage area and set to measure the signal for a day to several months or even a few years. The correct timestamp can be re-constructed immediately after comparison with powerline frequency fingerprint timestamps stored in the database.

Embodiments of the method can also be used to carry out run-time clock verification. For example, a processing node of an industry system may lose clock synchronization because of various reasons, such as, for example, hardware clock faults, transient power failures, operating systems faults, blocked NTP traffic, and so forth. Powerline frequency fingerprint timestamping can function as an auxiliary clock to verify the integrity of a node's clock at run time. For instance, the auxiliary clock may send back a short piece of powerline frequency fingerprint timestamp attached with the local clock to the database, to ensure that the drift between the node's local clock and the database is within an acceptable threshold.

In addition, embodiments of the method can also be employed for authentication of critical sampled data. A sensor processing unit's clock may malfunction due to reasons, such as, for example, hardware fault, system reboot, network jam, and so forth. In this instance, the data measured by the processing unit may be useless since it has the wrong time information. The impact can be severe if the measured data is for critical system operation or diagnosis. Another concern is that the sampled data is in appropriate data that was not captured at a given advertised time. For reliable detection, the processing unit may be equipped with an ENF sensor, so that the data samples can be attached with powerline frequency fingerprint timestamps, which provide authenticated time.

Autonomous Phase Detection:

An electric grid typically has three phases R, Y and B. The ENF signals observed in each phase for a given juncture have minor variations. These variations can be utilized to automatically identify the grid phase that a specific node is connected to.

Figure 6:
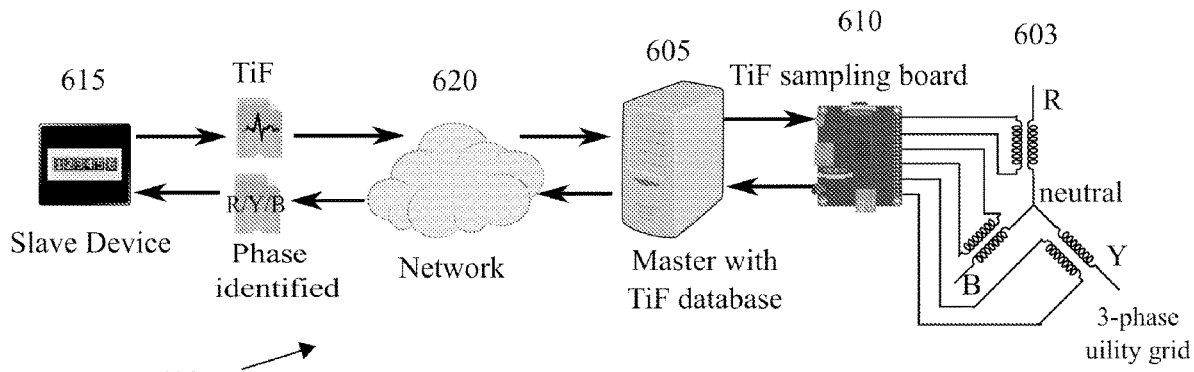
FIG. 6 shows an example of a system for ensuring accuracy of synchronisation for the system of FIG. 5.

A master-slave architecture/system 600 is shown in FIG. 6. In the system 600, a centralized server 605 is equipped with a TiF sampling board 610 with three channels connected respectively to the three grid phases of power grid 603. Once the centralised server 605 detects the phase a slave device 615 (typically an IoT device), it can perform more accurate time synchronization. The centralised server 605 can be controlled by an entity that administers to all the slave devices 615. The system 600 also includes a communications network 620 which enables communications between respective components of the system 600.

The communications network 620 can be of any appropriate form, such as the Internet and/or a number of local area networks (LANs). It will be appreciated that the configuration shown in FIG. 6 is for the purpose of example only, and in practice the respective components of the system 600 can communicate via any appropriate mechanism, such as via wired or wireless connections, including, but not limited to mobile networks, private networks, such as an 802.11 network, the Internet, LANs, WANs, or the like, as well as via direct or point-to-point connections, such as Bluetooth, or the like.

Figure 8:
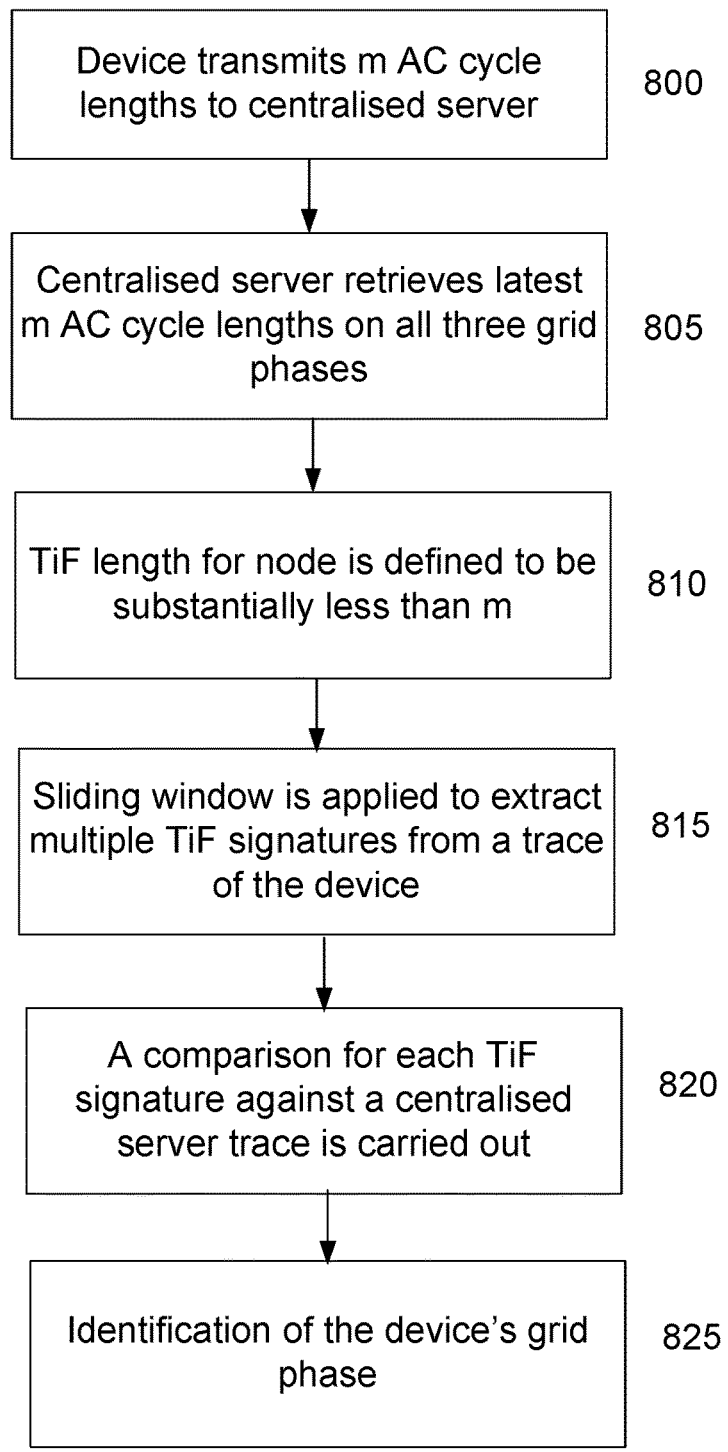
FIG. 8 shows a flow chart of an example of a grid phase identification method.

To auto detect a device phase, an autonomous grid phase identification method is employed as shown in FIG. 8. At step 800, the slave device 615 captures and transmits m consecutive AC cycle lengths to the centralised server 605. At step 805, upon receiving the data, the centralised server 605 retrieves the latest m consecutive AC cycle lengths on all the three grid phases.

At step 810, the TiF length is defined to be substantially less than m. Subsequently, at step 815, a sliding window is applied to extract multiple TiF signatures from a trace of the slave device 615. At step 820, each TiF signature is slided a window within the centralised server's 605 trace to identify the closest match so as to generate quasi decoding errors and form a discrete probability distribution function (pdf) of the quasi errors. Finally, at step 825, the slave device's 615 grid phase is identified as the centralised server's 605 grid phase that yields a pdf with the highest bar among all the three pdfs.

Broadly, the aforementioned methods identify frequency fingerprints from voltage fluctuations, for example, an ENF signal. The frequency fingerprints indicates the time information. By comparing the frequency fingerprints from different devices/nodes, the time offset between the two devices/nodes can be known. In this regard, time-related tasks can be carried out, such as, for example, secure time synchronization for distributed devices, network-free data logging, run-Time clock verification, authentication of critical sampled recorded data and so forth.

The following section will provide some further information on an example of the centralised server 605. It may be formed of any suitable processing device, and one such suitable device is shown in FIG. 9.

Figure 9:
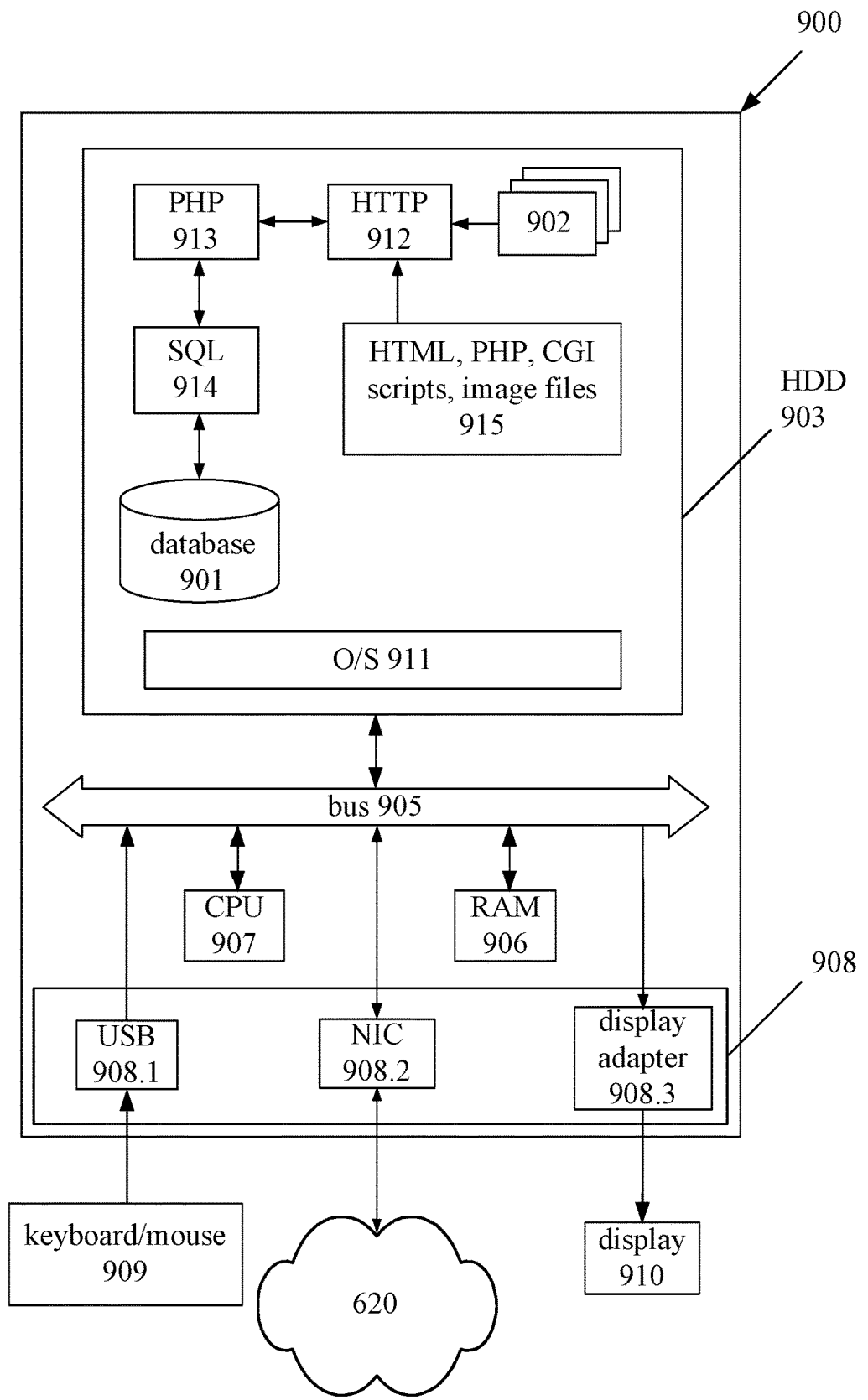
FIG. 9 shows a schematic diagram of a centralised server of FIG. 6.

In this example as shown in FIG. 9, a processing device is provided by a computing system 900 in communication with a database 901. The computing system 900 is able to communicate with slave devices 615, as required, over a communications network 620 using standard communication protocols.

The components of the computing system 900 can be configured in a variety of ways. The components can be implemented entirely by software to be executed on standard computer server hardware, which may comprise one hardware unit or different computer hardware units distributed over various locations, some of which may require the communications network 620 for communication. A number of the components or parts thereof may also be implemented by application specific integrated circuits (ASICs) or field programmable gate arrays.

In the example shown in FIG. 9, the computing system 900 is a commercially available server computer system based on a 32 bit or a 64 bit Intel architecture, and the processes and/or methods executed or performed by the computing system 900 are implemented in the form of programming instructions of one or more software components or modules 902 stored on non-volatile (e.g., hard disk) computer-readable storage 903 associated with the computing system 900. At least parts of the software modules 902 could alternatively be implemented as one or more dedicated hardware components, such as application-specific integrated circuits (ASICs) and/or field programmable gate arrays (FPGAs).

The computing system 900 includes at least one or more of the following standard, commercially available, computer components, all interconnected by a bus 905:
1. random access memory (RAM) 906;
2. at least one computer processor 907, and
3. external computer interfaces 908:
   a. universal serial bus (USB) interfaces 908.1 (at least one of which is connected to one or more user-interface devices, such as a keyboard, a pointing device (e.g., a mouse 909 or touchpad),
   b. a network interface connector (NIC) 908.2 which connects the computing system 900 to a data communications network 620; and
   c. a display adapter 908.3, which is connected to a display device 910 such as a liquid-crystal display (LCD) panel device.

The computing system 900 includes a plurality of standard software modules, including:
1. an operating system (OS) 911 (e.g., Mac, Linux or Microsoft Windows);
2. web server software 912 (e.g., Apache, available at http://www.apache.org);
3. scripting language modules 913 (e.g.,Microsoft ASP); and
4. structured query language (SQL) modules 914 (e.g., MySQL, available from http://www.mysql.com), which allow data to be stored in and retrieved/accessed from an SQL database.

Together, the web server 912, scripting language 913, and SQL modules 914 provide the computing system 900 with the general ability to allow users of the Internet (via the communications network 620) with standard computing devices equipped with standard web browser software to access the computing system 900 and in particular to provide data to and receive data from the database 901 (for example, data of mobile device software). It will be understood by those skilled in the art that the specific functionality provided by the system 900 to such users is provided by scripts accessible by the web server 912, including the one or more software modules 902 implementing the processes performed by the computing system 900, and also any other scripts and supporting data 915, including markup language (e.g., HTML, XML) scripts, PHP (or ASP), and/or CGI scripts, image files, style sheets, and the like.

The boundaries between the modules and components in the software modules 902 are exemplary, and alternative embodiments may merge modules or impose an alternative decomposition of functionality of modules. For example, the modules discussed herein may be decomposed into submodules to be executed as multiple computer processes, and, optionally, on multiple computers. Moreover, alternative embodiments may combine multiple instances of a particular module or submodule. Furthermore, the operations may be combined or the functionality of the operations may be distributed in additional operations in accordance with the invention. Alternatively, such actions may be embodied in the structure of circuitry that implements such functionality, such as the micro-code of a complex instruction set computer (CISC), firmware programmed into programmable or erasable/programmable devices, the configuration of a field-programmable gate array (FPGA), the design of a gate array or full-custom application-specific integrated circuit (ASIC), or the like.

Each of the steps of the processes performed by the computing system 900 may be executed by a module (of software modules 902) or a portion of a module. The processes may be embodied in a non-transient machine-readable and/or computer-readable medium for configuring a computer system to execute the method. The software modules may be stored within and/or transmitted to a computer system memory to configure the computing system 900 to perform the functions of the module.

The computing system 900 normally processes information according to a program (a list of internally stored instructions such as a particular application program and/or an operating system) and produces resultant output information via input/output (I/O) devices 908. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Throughout this specification and claims which follow, unless the context requires otherwise, the word "comprise", and variations such as "comprises" or "comprising", will be understood to imply the inclusion of a stated integer or group of integers or steps but not the exclusion of any other integer or group of integers.

Persons skilled in the art will appreciate that numerous variations and modifications will become apparent. All such variations and modifications which become apparent to persons skilled in the art, should be considered to fall within the spirit and scope that the invention broadly appearing before described.

The invention claimed is:

1. A system for determining a timestamp using powerline voltage fluctuations, the system including one or more electronic devices configured to:
   determine, at a first node, a first voltage fluctuation sequence;
   determine, at a second node, the second node being on a power grid of the first node, a second voltage fluctuation sequence; and
   compare, data of the first and second voltage fluctuation sequences, to determine a clock offset between the first and second nodes,
   wherein each fluctuation sequence is a timestamp.

2. The system of claim 1, wherein each node includes a sensor to determine voltage fluctuations from either the node or a source in close proximity to the node.

3. The system of claim 1, wherein the second node includes a timing apparatus for timestamping the clock offset, the timing apparatus being either a global navigation satellite system (GNSS) receiver or an atomic clock.

4. The system of claim 1, wherein the clock offset is determined using the formula:

$$i^* = \mathrm{argmin}_{i \in [1, m-n+1]} \text{ dissimilarity}(f, g[i:i+n-1])$$

5. The system of claim 1, wherein the second node further includes a voltage sensor for determining voltage fluctuations at a power outlet of the second node.

6. The system of claim 1, wherein data of the first and second voltage fluctuation sequences are processed to remove DC bias and high frequency spikes.

7. The system of claim 1, wherein the voltage fluctuations result from either ENF or EMR fluctuations.

8. A data processor implemented method for determining a timestamp using powerline voltage fluctuations, the method including:
   determining, at a first node, a first voltage fluctuation sequence;
   determining, at a second node, the second node being on a power grid of the first node, a second voltage fluctuation sequence; and
   comparing, data of the first and second voltage fluctuation sequences, to determine a clock offset between the first and second nodes,
   wherein each fluctuation sequence is a timestamp.

9. The method of claim 8, wherein each node includes a sensor to determine voltage fluctuations.

10. The method of claim 8, wherein the second node includes a timing apparatus for timestamping the clock offset, the timing apparatus being either a global navigation satellite system (GNSS) receiver or an atomic clock.

11. The method of claim 8, wherein the clock offset is determined using the formula:

$$i^* = \mathrm{argmin}_{i \in [1, m-n+1]} \text{ dissimilarity}(f, g[i:i+n-1])$$

12. The method of claim 8, wherein the second node further includes a voltage sensor for determining voltage fluctuations at a power outlet of the second node.

13. The method of claim 8, wherein the data of the first and second voltage fluctuation sequences is processed to remove DC bias and high frequency spikes.

14. The method of claim 8, wherein the voltage fluctuations result from either ENF or EMR fluctuations.

15. A non-transitory computer readable storage medium embodying thereon a program of computer readable instructions which, when executed by one or more processors of a first node in communication with at least one other processor of a second node, cause the first node to carry out a method for determining a timestamp using powerline voltage fluctuations, the method embodying the steps of:
   receiving, at a first node, first data of a first voltage fluctuation sequence at a second node, the second node being on a power grid of the first node;
   determining, at the first node, second data of a second voltage fluctuation sequence; and
   comparing, the first and second data, to determine a clock offset between the first and second nodes,
   wherein each fluctuation sequence is a timestamp.

16. A system for synchronising clocks, the system including one or more electronic devices that:
   determine, at a first node, a first node marker and a first node clock value;
   transmit, from the first node, a first data packet including the first node clock value and the first node marker;
   determine, at a second node, a second node marker and a second node clock value;
   receive, at the second node, the first data packet;
   synchronise, at the second node, both the first node clock value and the second node clock value, and
   determine, at the second node, an offset between the first node clock value and the second node clock value,
   wherein the respective node markers are determined from minute fluctuations of a cycle length of an electric voltage signal at each respective node.

17. The system of claim 16, the system including one or more electronic devices that further transmit, from the second node, a second data packet including the offset.

18. The system of claim 16, wherein each respective marker is a vector of successive AC cycle lengths of the electric voltage signal at each respective node.

19. The system of claim 16, the system including one or more electronic devices that further determine, at the second node, of a power grid phase of the first node, wherein determination of the power grid phase includes use of a decoding algorithm.

* * * * *